(12) United States Patent
Abe

(10) Patent No.: US 10,959,320 B2
(45) Date of Patent: Mar. 23, 2021

(54) CIRCUIT BOARD AND ELECTRONIC DEVICE INCLUDING CIRCUIT BOARD

(71) Applicant: KYOCERA Corporation, Kyoto (JP)

(72) Inventor: Yuichi Abe, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/631,905

(22) PCT Filed: Aug. 27, 2018

(86) PCT No.: PCT/JP2018/031530
§ 371 (c)(1),
(2) Date: Jan. 17, 2020

(87) PCT Pub. No.: WO2019/044752
PCT Pub. Date: Mar. 7, 2019

(65) Prior Publication Data
US 2020/0163200 A1 May 21, 2020

(30) Foreign Application Priority Data
Aug. 29, 2017 (JP) .............................. JP2017-164455

(51) Int. Cl.
| | |
|---|---|
| *H05K 1/02* | (2006.01) |
| *H01L 23/15* | (2006.01) |
| *H01L 23/367* | (2006.01) |
| *H01L 23/373* | (2006.01) |
| *H01L 23/498* | (2006.01) |
| *H05K 1/03* | (2006.01) |
| *H05K 1/09* | (2006.01) |
| *H05K 1/11* | (2006.01) |
| *H05K 1/18* | (2006.01) |

(52) U.S. Cl.
CPC ........... *H05K 1/0206* (2013.01); *H01L 23/15* (2013.01); *H01L 23/367* (2013.01); *H01L 23/3731* (2013.01); *H01L 23/49827* (2013.01); *H01L 23/49838* (2013.01); *H05K 1/0306* (2013.01); *H05K 1/09* (2013.01); *H05K 1/113* (2013.01); *H05K 1/181* (2013.01)

(58) Field of Classification Search
CPC ........ H05K 1/0206; H05K 1/09; H05K 1/113; H01L 23/15; H01L 23/367; H01L 23/3731; H01L 23/49827; H01L 23/49838
USPC ........................................................ 174/262
See application file for complete search history.

(56) References Cited

U.S. PATENT DOCUMENTS

| | | | | |
|---|---|---|---|---|
| 2004/0212085 A1* | 10/2004 | Nomura | ............... | H05K 3/4061 257/734 |
| 2014/0268589 A1* | 9/2014 | Nakamura | ............... | H01L 23/15 361/748 |
| 2015/0146393 A1* | 5/2015 | Uzoh | ..................... | H05K 1/115 361/760 |

FOREIGN PATENT DOCUMENTS

JP 2015-065442 A 4/2015

\* cited by examiner

*Primary Examiner* — Sherman Ng
(74) *Attorney, Agent, or Firm* — Volpe Koenig

(57) ABSTRACT

A circuit board according to the present disclosure includes a substrate that includes a through hole, and a penetrating conductor positioned inside of the through hole. The substrate is made of a ceramic. The penetrating conductor contains silver and copper that are main components; at least one selected from a group A of titanium, zirconium, hafnium, and niobium; at least one selected from a group B of molybdenum, tantalum, tungsten, rhenium, and osmium; and a first alloy made of one of (i) silver and indium and (ii) silver and tin.

9 Claims, 3 Drawing Sheets

CIRCUIT BOARD AND ELECTRONIC DEVICE INCLUDING CIRCUIT BOARD

FIELD

The present disclosure relates to a circuit board and an electronic device including the circuit board.

BACKGROUND

There has been known an electronic device including a metal layer in a circuit board, on which various electronic components such as a semiconductor element, a heating element, and a Peltier element are mounted. A circuit board employed for such a use includes (i) a substrate having a through hole and (ii) a conductor (hereinafter, may be referred to as "penetrating conductor") positioned inside of the through hole, and the penetrating conductor is electrically bonded to the metal layer. An electric signal is input, via the penetrating conductor, from the outside to the electronic component mounted on the metal layer (see Patent Literature 1, for example).

CITATION LIST

Patent Literature

Patent Literature 1: Japanese Patent Application Laid-open No. 2015-065442

SUMMARY

Solution to Problem

A circuit board according to present disclosure includes a substrate that includes a through hole; and a penetrating conductor positioned inside of the through hole. The substrate is made of a ceramic. The penetrating conductor contains silver and copper that are main components; at least one selected from a group A of titanium, zirconium, hafnium, and niobium; at least one selected from a group B of molybdenum, tantalum, tungsten, rhenium, and osmium; and a first alloy made of one of (i) silver and indium and (ii) silver and tin.

An electronic device according to present disclosure includes the circuit board having the above-mentioned configuration and an electronic component positioned on the metal layer of the circuit board.

DESCRIPTION OF EMBODIMENTS

An electronic component positioned on a metal layer generates heat during its operation. Moreover, a heat amount to be added to a circuit board per unit volume is increasing due to recent high integration of electronic components and/or recent decrease in size and thickness of an electronic device. Therefore, when a circuit board is repeatedly heated up and cooled down by operation of electronic components, a crack is easily generated in a penetrating conductor of the circuit board from a part being in contact with an inner wall of a through hole, thereby leading to increase in an electric resistance value of the penetrating conductor.

Considering these situations, in order to withstand a long-time use, there is desired a circuit board including a penetrating conductor in which a crack, which is a cause of increase in the electric resistance value, is hardly generated even when the circuit board is repeatedly heated up and cooled down.

In a circuit board according to the present disclosure, a crack is hardly generated in a penetrating conductor even when the circuit board is repeatedly heated up and cooled down, and thus an electric resistance value of the penetrating conductor hardly increases, so that the circuit board withstands a long-time use.

An electronic device according to the present disclosure includes the circuit board according to the present disclosure, and thus the electronic device has a high reliability.

Hereinafter, details of the circuit board and the electronic device according to the present disclosure will be explained with reference to accompanying drawings.

Figure 1:
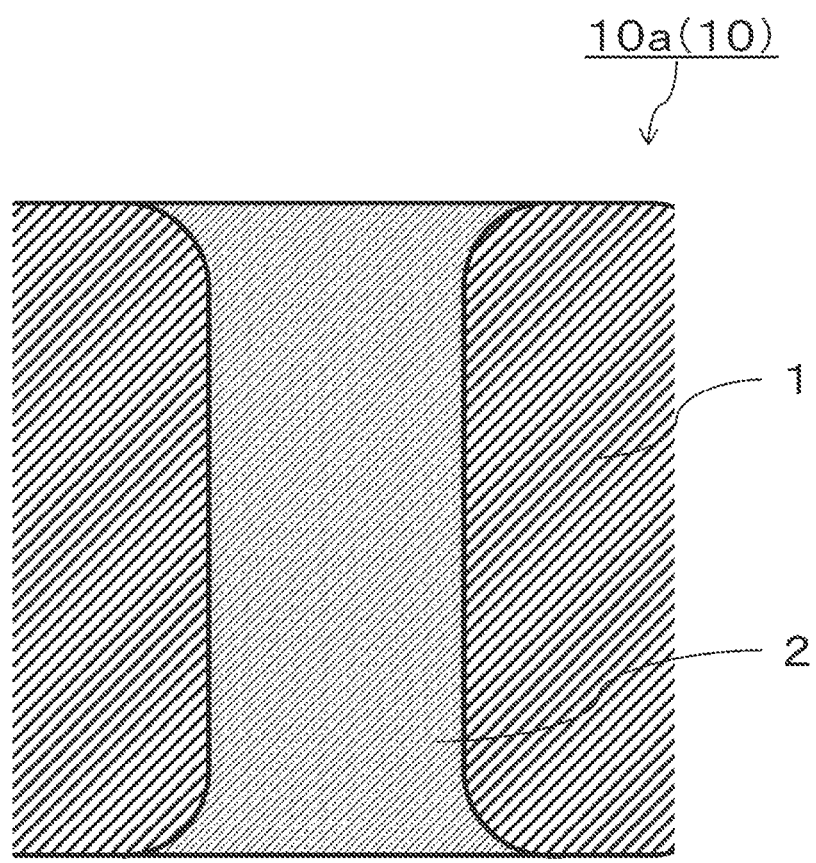
FIG. 1 is a cross sectional view schematically illustrating one example of the vicinity of a through hole in a circuit board according to the present disclosure.

As illustrated in FIG. 1, a circuit board 10 according to the present disclosure includes a substrate 1 including a through hole and a penetrating conductor 2 positioned inside of the through hole. Note that the substrate 1 is made of ceramic. As the ceramic, for example, any of a silicon-carbide-based ceramic, an aluminum-oxide-based ceramic, a silicone-nitride-based ceramic, an aluminum-nitride-based ceramic, a mullite-based ceramic, etc. may be employed.

When the substrate 1 is made of a nitride-based ceramic such as an aluminum-nitride-based ceramic, heat dissipation of the circuit board 10 is improved by its high thermal conductivity. The aluminum-nitride-based ceramic is provided in such a manner that aluminum nitride occupies equal to or more than 70% by mass of 100% by mass of all components composing the aluminum-nitride-based ceramic.

Material of the substrate 1 may be identified by the following method. First, the substrate 1 is measured by using an X-ray diffractometer (XRD) and identification thereof is executed from a value of an obtained 2θ (where 2θ is a diffraction angle) by using a JCPDS card. Next, quantitative analysis of the substrate 1 is executed by using an Inductively Coupled Plasma (ICP) emission spectrophotometer (ICP). When a component identified by XRD is aluminum nitride and a value obtained by converting a content of aluminum (Al) that is measured by an ICP into that of aluminum nitride (AlN) is equal to or more than 70% by mass, it is an aluminum-nitride-based ceramic. Note that the same applies to other ceramics.

In FIG. 1, a drum shape that expands toward a upper portion and a lower portion of the substrate 1 is illustrated as a cross-sectional shape of a through hole; however, not limited thereto, the cross-sectional shape may be a simple rectangular shape.

Main components of the penetrating conductor 2 are silver and copper. Main components are silver and copper means a total of silver and copper is equal to or more than 83% by mass of 100% by mass of all components composing the penetrating conductor 2. As described above, main components of the penetrating conductor 2 are silver and copper each having a high thermal conductivity, the penetrating conductor 2 of the circuit board 10 according to the present disclosure has an excellent heat dissipation, and a crack hardly occurs in the penetrating conductor 2 even when the circuit board 10 is repeatedly heated up and cooled down, so that an electric resistance value of the penetrating conductor 2 hardly increases. In the penetrating conductor 2, silver may be equal to or more than 65% by mass and equal to or less than 75% by mass of 100% by mass of all components composing the penetrating conductor 2, and copper may be equal to or more than 18% by mass and equal to or less than 30% by mass of 100% by mass of all components composing the penetrating conductor 2.

The penetrating conductor 2 contains (i) at least one selected from a group A of titanium, zirconium, hafnium, and niobium, (ii) at least one selected from a group B of molybdenum, tantalum, tungsten, rhenium, and osmium, and (iii) a first alloy made of silver and indium, or, silver and tin. In other words, the first alloy is any one of an Ag—In alloy and an Ag—Sn alloy.

As described above, when the penetrating conductor 2 contains the group A, an inner wall of the through hole is stiffly bonded to the penetrating conductor 2, and thus the penetrating conductor 2 is hardly separated from the inner wall of the through hole when heating up and cooling down are repeated, thereby leading to prevention against occurrence of a crack.

Moreover, when the penetrating conductor 2 contains the group B, the group B plays a role of an aggregate, and another component (silver, copper, group A, and/or first alloy to be mentioned later) fills gaps between the group B (aggregate), thereby leading to reduction in the number of pores each of which easily becomes a starting point of occurrence of a crack in the penetrating conductor 2.

The penetrating conductor 2 contains the first alloy, and thus pores disappear during generation of the first alloy in fabricating the penetrating conductor 2, thereby leading to reduction in amount of the pores.

Thus, in the circuit board 10 according to the present disclosure that satisfies such a composition, a crack hardly occurs in the penetrating conductor 2 from a portion being in contact with the inner wall of the through hole even when heating up and cooling down are repeated, and thus an electric resistance value of the penetrating conductor 2 hardly increases, so that the circuit board withstands a long-time use.

Components (silver, copper, group A, and group B) composing the penetrating conductor 2 and contents thereof may be identified by the following method. First, the circuit board 10 is cut so as to obtain a cross-sectional shape illustrated in FIG. 1, and then is polished by using a Cross section Polisher (CP) to obtain a polished surface. Next, for the polished surface as an observation surface, the components composing the penetrating conductor 2 and contents thereof are measured by using an Energy Dispersive x-ray Spectroscopy (EDS) attached to a Scanning Electron Microscope (SEM). Or, the penetrating conductor 2 may be scraped off, and the components composing the penetrating conductor 2 and contents thereof may be measured by using an Inductively Coupled Plasma spectrometer (ICP) or an X-ray fluorescence spectrometer (XRF).

Furthermore, whether or not the penetrating conductor 2 contains the first alloy that is made of silver and indium, or, silver and tin may be identified by the following method. Surface analysis is performed on the above-mentioned polished surface as a measurement surface by using Electron Probe Micro Analyzer (EPMA). When a portion is identified in which there simultaneously present silver and indium in color mapping of the surface analysis, it is estimated that the first alloy made of silver and indium is contained. Similarly, when a portion is identified in which there simultaneously present silver and tin in color mapping of the surface analysis, it is estimated that the first alloy made of silver and tin is contained. That a portion is identified in which there simultaneously present means that when a result of surface analysis with respect to silver and that with respect to indium are overlapped with each other, there presents an overlapped region between their present portions, for example.

A total content of the group A in the penetrating conductor 2 may be equal to or more than 1.5% by mass and equal to or less than 3.0% by mass of 100% by mass of all components composing the penetrating conductor 2. When such a composition is satisfied, an inner wall of the through hole is more stiffly bonded to the penetrating conductor 2, and thus the penetrating conductor 2 is hardly separated from the inner wall of the through hole when heating up and cooling down are repeated, thereby leading to more reliable prevention against occurrence of a crack.

A total content of the group B of the penetrating conductor 2 may be equal to or more than 3.0% by mass and equal to or less than 8.0% by mass of 100% by mass of all components composing the penetrating conductor 2. When such a composition is satisfied, the group B effectively plays a role of an aggregate, and another component fills gaps of the group B (aggregate), thereby leading to further reduction in the number of pores each of which easily becomes a starting point of occurrence of a crack.

An area occupancy of the first alloy in the penetrating conductor 2 may be equal to or more than 5% by area and equal to or less than 25% by area. When such a composition is satisfied, it is possible to further reduce amount of pores while keeping the ductility of the penetrating conductor 2 high.

An average value of a circle equivalent diameter of the first alloy may be equal to or more than 5 μm and equal to or less than 30 μm, for example.

An area occupancy of the first alloy in the penetrating conductor 2 and an average value of a circle equivalent diameter of the first alloy may be computed by the following method. First, the polished surface is obtained by the above-mentioned method, and then presence of the first alloy is identified. Next, the first alloy is painted in black in a photograph of the polished surface which is taken by using SEM. Next, the photograph is read as image data, a method of a particle analysis in image analyzing software "A zo-kun" (Registered Trademark: made by Asahi Kasei Engineering Corp.; hereinafter, image analyzing software "A zo-kun" indicates image analyzing software made by Asahi Kasei Engineering Corp.) is applied to the photograph to execute an image analysis, and an area occupancy of the first alloy and an average value of a circle equivalent diameter of the first alloy are computed. As analysis conditions of "A zo-kun", the brightness of particles is "dark", a method for binarization is "manual", a small-figure removal is "0.01 μm", and a threshold is "180", for example.

A content of indium or tin in the penetrating conductor 2 may be equal to or more than 1.0% by mass and equal to or less than 3.0% by mass of 100% by mass of all components composing the penetrating conductor 2. When such a composition is satisfied, the melting point of the penetrating conductor 2 is able to be lowered while maintaining the ductility of the penetrating conductor 2, so that it is possible to reduce amount of pores that occur in fabricating the penetrating conductor 2.

As described above, contents of indium and tin in the penetrating conductor 2 are able to be obtained by performing measurement using EDS, XRF, or ICP.

The penetrating conductor 2 may contain particles of copper, and an area occupancy of the particle of copper having circle equivalent diameter equal to or less than 5 μm may be equal to or more than 5% by area and equal to or less than 15% by area. When such a composition is satisfied, particles of copper have an excellent ductibility, and thus the ductility of the penetrating conductor 2 is improved, and a crack hardly occurs in the penetrating conductor 2 even when heating up and cooling down are repeated.

An area occupancy of particles of copper having circle equivalent diameter equal to or less than 5 μm in the penetrating conductor 2 may be computed by the following method. By the above-mentioned method, after the polished surface is obtained, a surface analysis is performed on the polished surface by using EPMA. In a portion visually recognized as a particle by color mapping of the surface analysis, when a content of copper in the particle is larger than that in another portion, the particle is estimated as a particle of copper.

Next, by using a photograph of a portion having the same range on which the above-mentioned surface analysis has been performed, which is taken by using SEM, the particle of copper estimated from the result of color mapping is painted in black. Next, by using the photograph, a method named a particle analysis of the image analyzing software "A zo-kun" is applied so as to perform an image analysis, and computes a circle equivalent diameter and an area of each particle of copper. Thus, areas of particles of copper may be summed up whose circle equivalent diameters are equal to or less than 5 μm, and an area occupancy of the particles of copper whose circle equivalent diameters are equal to or less than 5 μm may be computed. As analysis conditions of "A zo-kun", the brightness of particles is "dark", a method for binarization is "manual", a small-figure removal is "0.01 μm", and a threshold is "180", for example.

A content of oxygen may be equal to or less than 0.15% by mass of 100% by mass of all components composing the penetrating conductor 2. When such a composition is satisfied, components composing the penetrating conductor 2 and oxygen hardly form an oxide, and thus an inner wall of the through hole is more stiffly bonded to the penetrating conductor 2. After obtaining the polished surface by the above-mentioned method, electron beam may be emitted, by using EPMA, to the penetrating conductor 2 of the polished surface so as to measure a content of oxygen.

The penetrating conductor 2 may include, in a portion being in contact with an inner wall of the through hole, a bonding layer that contains a component contained in the substrate 1 and the group A contained in the penetrating conductor 2, and the maximum thickness of the bonding layer may be equal to or more than 3 μm and equal to or less than 10 μm. As described above, when a bonding layer having the above-mentioned thickness is provided, the inner wall of the through hole is more stiffly bonded to the penetrating conductor 2, and heat of the penetrating conductor 2 is easily dissipated to the substrate 1 via the bonding layer, so that a crack hardly occurs in the penetrating conductor 2 even when heating up and cooling down are repeated. In the above-mentioned bonding layer, the group A contained in the penetrating conductor 2 is not limited to a single component.

The bonding layer that contains a component, contained in the substrate 1, and the group A, contained in the penetrating conductor 2, is a layer of nitride containing nitrogen and the group A when the substrate 1 is nitride-based ceramic, a layer of oxide containing oxygen and the group A when the substrate 1 is oxide-based ceramic, and a layer of carbide containing carbon and the group A when the substrate 1 is carbide-based ceramic.

Presence/absence of a bonding layer may be identified by the following method. First, the circuit board 10 is cut so as to obtain a cross-sectional shape illustrated in FIG. 1, and then is polished by using CP to obtain a polished surface. Next, a surface analysis is performed on the polished surface as a measurement surface by using EPMA, and when the substrate 1 is nitride-based ceramic, if there presents a layer of nitride containing nitrogen and the group A contained in the penetrating conductor 2 in a portion being in contact with an inner wall of the through hole of the penetrating conductor 2, the layer may be estimated to be the bonding layer. The maximum thickness of the bonding layer may be measured from a photograph taken by using SEM.

Figure 2:
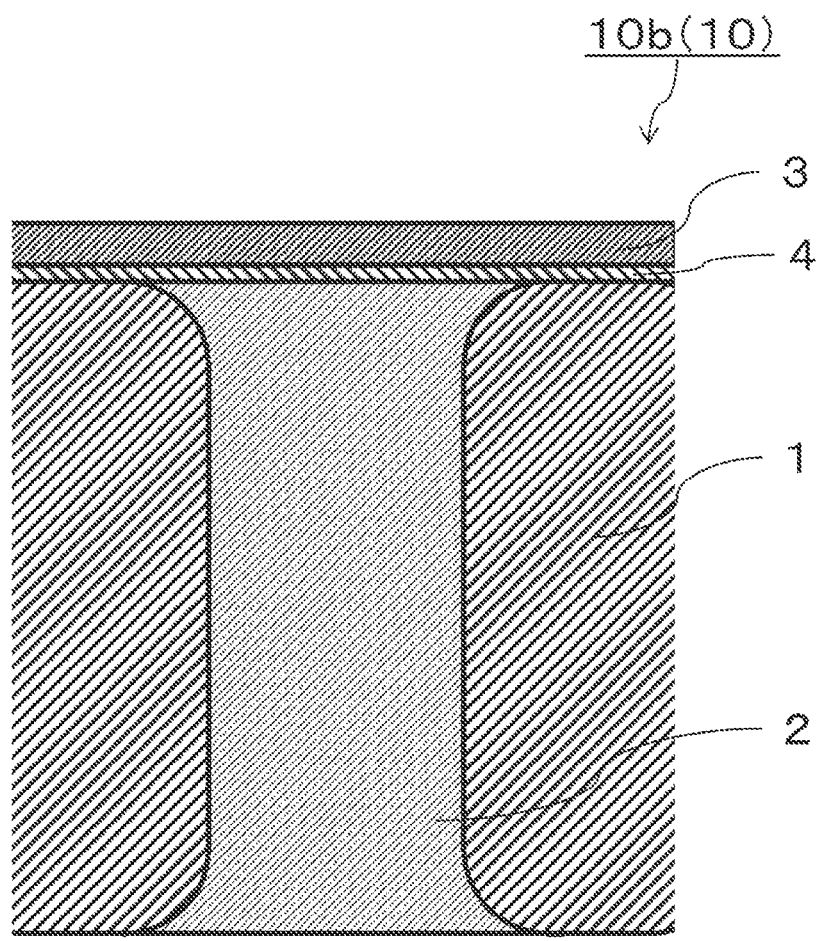
FIG. 2 is a cross sectional view schematically illustrating another example of the vicinity of the through hole in the circuit board according to the present disclosure.

As illustrated in FIG. 2, the circuit board 10 according to the present disclosure may include a metal layer 3 positioned on the substrate 1 and the penetrating conductor 2. As exemplified in FIG. 2, the metal layer 3 is provided on an upper surface of the substrate 1 and on an upper surface of the penetrating conductor 2; however, the metal layer 3 may be provided at least on either an upper surface or a lower surface of the substrate 1 and the penetrating conductor 2. Moreover, the metal layer 3 may be provided on both of the upper surface and the lower surface of the substrate 1 and the penetrating conductor 2.

A main component of the metal layer 3 may be gold, silver, copper, or nickel. That a main component is gold, silver, copper, or nickel means that a content of gold, silver, copper, or nickel is equal to or more than 50% by mass of 100% by mass of all components composing the metal layer 3. As described above, in a case where a main component of the metal layer 3 is gold, silver, copper, or nickel having a low electric resistance value, when an electronic component is mounted on the metal layer 3, the responsiveness of the electronic component is able to be improved. Similarly to the penetrating conductor 2, a content of each of the components composing the metal layer 3 is able to be measured by using EDS, XRF, or ICP.

As illustrated in FIG. 2, when including the metal layer 3, the circuit board 10 according to the present disclosure includes a thin-film layer 4 positioned between the penetrating conductor 2 and the metal layer 3, and a main component of the thin-film layer 4 may be titanium or churomium. That a main component is titanium or churomium means that a content of titanium or churomium is equal to or more than 90% by mass of 100% by mass of all components composing the thin-film layer 4.

When such a composition is satisfied, the metal layer is stiffly bonded to the penetrating conductor 2, a crack further hardly occurs in the penetrating conductor 2 even when heating up and cooling down are repeated, and thus an electric resistance value further hardly increases.

At an interface between the penetrating conductor 2 and the thin-film layer 4, the circuit board 10 according to the present disclosure may contain a second alloy containing at least one selected from among a component composing the thin-film layer 4, silver, copper, indium, and tin.

When such a composition is satisfied, because of the presence of the second alloy, the penetrating conductor 2 is stiffly bonded to the thin-film layer 4, a crack further hardly occurs in the penetrating conductor 2 even when heating up and cooling down are repeated, and thus an electric resistance value further hardly increases.

When a main component of the thin-film layer 4 is titanium, the second alloy is an alloy containing at least one selected from among titanium, silver, copper, indium, and tin, for example. When a main component of the thin-film layer 4 is churomium, the second alloy is an alloy containing at least one selected from among churomium, silver, copper, indium, and tin, for example.

An average value of a circle equivalent diameter of the second alloy may be equal to or more than 50 nm and equal to or less than 500 nm, for example.

Whether or not there presents the second alloy at an interface between the penetrating conductor 2 and the thin-film layer 4 may be identified by the following method. A region that includes an interface between the penetrating conductor 2 and the thin-film layer 4 is cut out, by a thickness of equal to or less than 100 nm, from the circuit board 10 by using ion beam or the like, and observation is performed on the interface by using a transmission electron microscope (TEM) at equal to or more than 50000 power. When a measurement is performed by using EDS and there presents an alloy containing at least one selected from among a component composing the thin-film layer 4, silver, copper, indium, and tin, the present component is the second alloy.

Next, the second alloy is painted in black in a portion having the same range on which the above-mentioned analysis has been performed, by using a photograph taken by TEM. Next, by using the photograph, a method named a particle analysis of the image analyzing software "A zo-kun" is applied so as to perform an image analysis, and computes an average value of a circle equivalent diameter of the second alloy. As analysis conditions of "A zo-kun", the brightness of particles is "dark", a method for binarization is "manual", a small-figure removal is "0.01 μm", and a threshold is "180", for example.

Figure 3:
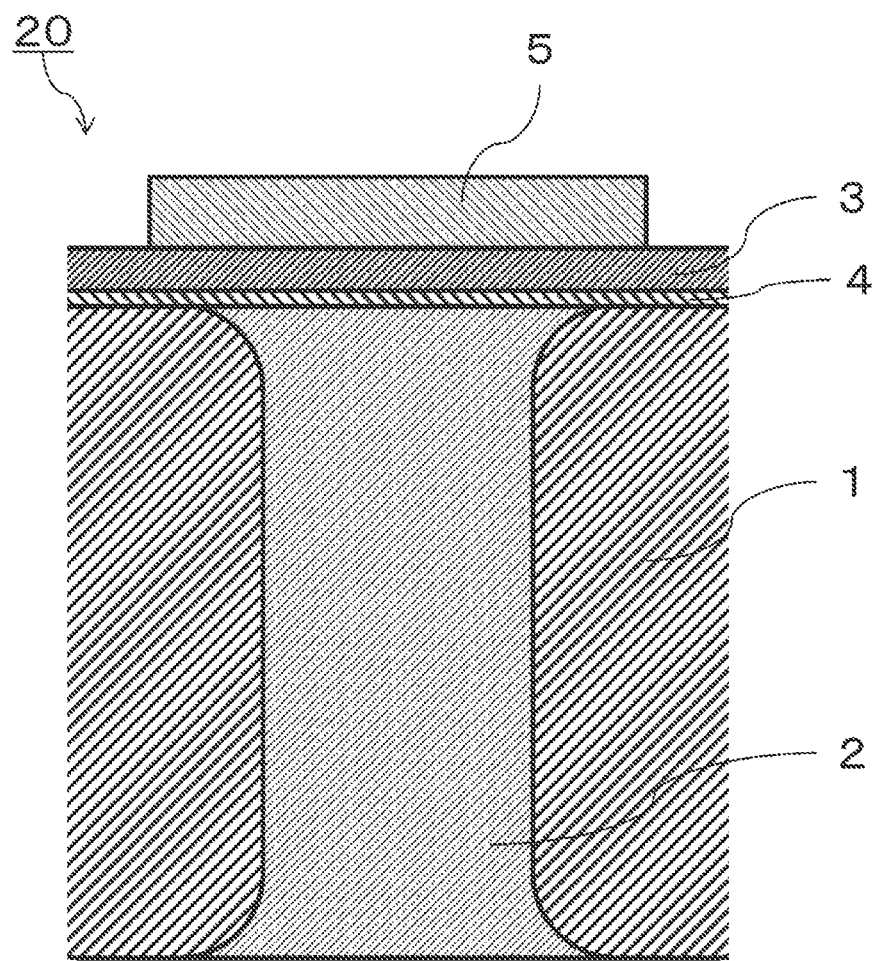
FIG. 3 is a cross sectional view schematically illustrating one example of the vicinity of an electronic component in an electronic device according to the present disclosure.

As illustrated in FIG. 3, an electronic device 20 according to the present disclosure includes the circuit board according to the present disclosure and an electronic component 5 arranged on the metal layer 3 of the circuit board 10. The electronic device 20 according to the present disclosure includes the circuit board 10 according to the present disclosure that withstands a long-time use, and thus it has a high reliability.

For the electronic component 5, there may be may be employed, for example, a semiconductor element such as an light emitting diode (LED) element, an insulated gate bipolar transistor (IGBT) element, an intelligent power module (IPM) element, a metal-oxide-semiconductor field-effect transistor (MOSFET) element, a free wheeling diode (FWD) element, a giant transistor (GTR) element, a schottky barrier diode (SBD), a high electron mobility transistor (HEMT) element, and a complementary metal-oxide-semiconductor (CMOS); a heating element for a dye-sublimation thermal printer head or a thermal ink-jet printer head; a Peltier element; etc.

Hereinafter, one example of a manufacturing method of the circuit board 10 according to the present disclosure will be explained.

First, the substrate 1 is prepared by a well-known method, whose main component is aluminum nitride and which includes a through hole.

Next, metal paste to be the penetrating conductor 2 is fabricated. Silver powder, cupper powder, the group-A powder (titanium powder, zirconium powder, hafnium powder, niobium powder), the group-B powder (molybdenum powder, tantalum powder, tungsten powder, rhenium powder, osmium powder), and indium powder or tin powder are prepared, and the powders are weighed and mixed so that a total of silver powder and cupper powder is equal to or more than 83% by mass to obtain a mixed powder. Furthermore, organic vehicle is added to the mixed powder to obtain metal paste.

The organic vehicle is obtained by dissolving organic binder(s) in organic solvent, and as the organic binder, for example, one or more, selected among from acrylics such as polybutyl methacrylate and polymethyl methacrylate; celluloses such as nitrocellulose, ethylcellulose, acetylcellulose, and butylcellulose; polyethers such as polyoxymethylene; and polyvinyls such as polybutadiene and polyisoprene; may be mixed to be used.

As the organic solvent, for example, one or more, selected among from carbitol, carbitol acetate, α-terpineol, meta-cresol, dimethylimidazole, dimethyl imidazolidinone, dimethylformamide, diaceton alcohol, triethylene glycol, paraxylene, ethyl lactate, and isophorone, may be mixed to be used.

Next, the through hole of the substrate 1 is filled with the metal paste and then the metal paste is dried and held, in vacuum, at the maximum temperature of equal to or more than 780° C. and equal to or less than 850° C. and for equal to or more than 10 minutes and equal to or less than 60 minutes. The metal paste is held at the maximum temperature for the above-mentioned time interval, and then is cooled down to a room temperature with a temperature dropping rate of equal to or less than 10° C./min from the maximum temperature, so as to form the first alloy that is made of silver and indium, or, silver and tin. Thus, the circuit board 10 according to the present disclosure is obtained.

In order to make an area occupancy of the first alloy in the penetrating conductor 2 equal to or more than 5% by area and equal to or less than 25% by area, a total content of indium powder and tin powder may be adjusted, during fabrication of the mixed powder, to be equal to or more than 0.8% by mass and equal to or less than 5% by mass of 100% by mass of the mixed powder.

In the penetrating conductor 2, in order to make an area occupancy of a particle of copper whose circle equivalent diameter is equal to or less than 5 μm equal to or more than 5% by area and equal to or less than 15% by area, it is sufficient that cupper powder whose circle equivalent diameter is equal to or less than 5 μm is employed for the mixed powder and a content of the above-mentioned cupper powder in the mixed powder and a holding time interval of the maximum temperature during a thermal treatment are adjusted.

In the penetrating conductor 2, in order to make a content of oxygen equal to or less than 0.15% by mass of 100% by mass of a total mass composing the penetrating conductor 2, it is sufficient that contents of oxygen contained in the raw material powders are adjusted.

In the penetrating conductor 2, in order to obtain a bonding layer being in contact with an inner wall of the through hole, which contains at least one selected among from a component composing the substrate 1 and the group A contained in the penetrating conductor 2, and further in order to make the maximum thickness of the bonding layer equal to or more than 3 μm and equal to or less than 10 μm, it is sufficient that the maximum temperature during the thermal treatment is equal to or more than 800° C. and equal to or less than 840° C.

In order to obtain the circuit board 10 including the metal layer 3, it is sufficient that the metal layer 3 is formed on the substrate 1 and the penetrating conductor 2. As a fabrication method of the metal layer 3, any of a well-known metal pasting method, a well-known plating method, a well-known sputtering method, and the like may be employed.

The thin-film layer 4 whose main component is titanium or churomium may be formed between the penetrating conductor 2 and the metal layer 3. Hereinafter, one example of a fabrication method of the thin-film layer 4 and the metal layer 3 using a sputtering method will be explained. First, a surface of the substrate 1 including the penetrating conductor 2 is polished, on which the metal layer 3 is to be formed. Next, for example, when the metal layer 3 made of gold is to be formed, the thin-film layer 4 whose main component is titanium is formed on the polished surface by using a sputtering method. Next, gold is formed on the thin-film layer 4 by using a sputtering method to obtain the metal layer 3 made of gold. In this case, platinum may be formed on the thin-film layer 4 by using a sputtering method before the metal layer 3 is formed. If necessary, when an etching process is executed after a resist process, a desired pattern of the metal layer 3 is able to be obtained.

The surface of the metal layer 3 may be coated, by using a well-known plating method, by a coating layer composed of at least one selected from among silver, copper, nickel, palladium, and platinum.

In order to arrange the second alloy, which contains at least one selected from among a component composing the thin-film layer 4, silver, copper, indium, and tin, in the interface between the penetrating conductor 2 and the thin-film layer 4, it is sufficient that a surface of the penetrating conductor 2 is polished before the thin-film layer 4 is formed by a sputtering method, and then reverse sputtering is performed thereon that collides ions with the surface of the penetrating conductor 2 so as to activate silver, copper, indium, and tin on the surface of the penetrating conductor 2.

As described above, one example of a manufacturing method of the circuit board 10 according to the present disclosure has been explained; however, the manufacturing method of the circuit board 10 according to the present disclosure is not limited to the above-mentioned manufacturing method. For example, when using the substrate 1 having a dividing groove, the plurality of circuit boards 10 is able to be formed.

Next, as one example of a manufacturing method of the electronic device 20 according to the present disclosure, a manufacturing method of the electronic device 20 having a configuration illustrated in FIG. 3 will be explained. First, the circuit board 10 obtained by the above-mentioned manufacturing method is prepared. Next, the electronic component 5 is mounted on the metal layer 3 to obtain the electronic device 20 according to the present disclosure.

Hereinafter, details of practical examples according to the present disclosure will be explained; however, the present disclosure is not limited to the following practical examples.

Practical Example 1

Samples were fabricated in which presence/absence of the first alloy made of silver and indium, or, silver and tin in a penetrating conductor was different, and changes in electric resistance values in a heat cycle test were evaluated.

First, by a well-known method, a substrate made of an aluminum-nitride-based ceramic having a thickness of 0.38 mm, which included a through hole having a diameter of 100 µm, was prepared. Next, there were prepared silver powder whose average particle diameter was 2.5 µm, cupper powder whose average particle diameter was 2.5 µm, titanium powder whose average particle diameter was 5 µm as the group-A powder, molybdenum powder whose average particle diameter was 5 µm as the group-B powder, and indium powder whose average particle diameter was 10 µm or tin powder whose average particle diameter was 10 µm. The powders were weighed and mixed in such a manner that silver powder was 68.8% by mass, cupper powder was 25% by mass, titanium powder was 2.5% by mass, molybdenum powder was 3% by mass, tin powder was 0.7% by mass (sample No. 1 and sample No. 3), indium powder instead of tin powder was 0.7% by mass (sample No. 2), so as to obtain mixed powders. In each of the mixed powders, a content of oxygen contained in a corresponding raw material powder was adjusted so that a content of oxygen in a penetrating conductor was 0.20% by mass of 100% by mass of all components composing the penetrating conductor.

Next, 25 parts by mass of organic vehicle was added to 100 parts by mass of the mixed powder to obtain metal paste to be a penetrating conductor.

Next, a through hole of a substrate was filled with the metal paste, and then was dried in vacuum at the maximum temperature of 780° C. while holding the state for 20 minutes. Next, a temperature dropping rate from the maximum temperature of samples No. 1 and 2 was set to 10° C./min and that of sample No. 3 was set to 20° C./min to perform cooling down to a room temperature.

Next, both surfaces of the substrate, in which the penetrating conductor was formed, were polished, titanium, platinum, and gold were formed in this order on both surfaces of the substrate by a sputtering method, and a metal layer whose main component was gold was formed to obtain each of the samples. Thicknesses of titanium, platinum, and gold were 0.05 µm, 0.1 µm, and 3 µm in this order.

Next, whether or not a penetrating conductor of each of the samples contained the first alloy made of silver and at least one of indium and tin was identified by the following method. First, each of the samples was cut so that the cut sample had a cross-sectional shape illustrated in FIG. 1, and then the cut sample was polished by using CP to obtain a polished surface. Next, a surface analysis is performed on the polished surface as a measurement surface by using EPMA. When presence of silver and indium, or, silver and tin was simultaneously identified by color mapping of the surface analysis, it was estimated to be the first alloy made of silver and indium, or, silver and tin. As a result, presence of the first alloy was not identified in sample No. 3; on the other hand, presence of the first alloy made of silver and tin was identified in sample No. 1, and presence of the first alloy made of silver and indium was identified in sample No. 2.

Next, for each of the samples fabricated by the above-mentioned method, a terminal of an electrical resistance meter was in contact with a metal layer of a sample and a voltage of 3.5 mV was applied thereon to measure an electric resistance value including a penetrating conductor.

Next, for each of the samples, a heat cycle test in which heating up and cooling down were repeated was performed by the following method. First, each of the samples was put into a hot-cold shock testing equipment, a cycle was set to one cycle in which the temperature was lowered from a room temperature (25° C.) to −45° C. and held for 10 minutes, the temperature was then raised to 125° C. and held for 10 minutes, and then the temperature was lowered to the room temperature, and the cycle was repeated. The sample was put out for each 100 cycles, and an electric resistance value of the sample was measured by the above-mentioned method for measuring an electric resistance value. A cycle count was recorded when the electric resistance value increased from that before the heat cycle test by equal to or more than 100%. It means that the greater a value of the recorded cycle count was, the less the electric resistance value was increased even when heating up and cooling down were repeated.

Results are illustrated in Table 1.

TABLE 1

| Sample No. | First Alloy | Cycle Count (counts) |
|---|---|---|
| 1 | Ag—Sn | 600 |
| 2 | Ag—In | 700 |
| 3 | absent | 400 |

As illustrated in Table 1, cycle counts of samples No. 1 and 2 were equal to or more than 600 and were larger than that of sample No. 3. From these results, it was found that when a penetrating conductor contained the first alloy made of silver and indium, or, silver and tin, its electric resistance value was able to be kept low even when heating up and cooling down were repeated, so that the circuit board was capable of withstanding a long-time use.

Practical Example 2

Next, samples were fabricated in which area occupancies of the first alloy and contents of tin in penetrating conductors were different from one another, so as to evaluate changes in electric resistance values by a heat cycle test.

A fabricating method was similar to that of sample No. 1 according to Practical Example 1 except that when fabricating mixed powder, a content of tin powder of 100% by mass of the mixed powder was adjusted to be that illustrated in Table 2. Note that a content of silver powder was reduced in order to increase that of tin powder. Note that sample No. 4 was the same as sample No. 1 according to Practical Example 1.

Next, an area occupancy of an alloy in a penetrating conductor in each of the samples was computed by the following method. First, a polished surface was obtained by a method same as that according to Practical Example 1, and then presence of the first alloy was identified. Next, the first alloy was painted in black in a photograph of the polished surface which was taken by using SEM. Next, the photograph was read as image data, a method of a particle analysis in image analyzing software "A zo-kun" was applied to the photograph to execute an image analysis, and an area occupancy of the first alloy in the penetrating conductor was computed. As analysis conditions of "A zo-kun", the brightness of particles was "dark", a method for binarization was "manual", a small-figure removal was "0.01 μm", and a threshold was "180".

A content of tin in a penetrating conductor of each of the samples was measured by the following method. First, a polished surface was obtained by a method same as that according to Practical Example 1. Next, for the polished surface as an observation surface, a content of tin in a penetrating conductor of each of the samples was measured by using EDS attached to SEM.

The heat cycle test was performed on the obtained samples by a method same as that according to Practical Example 1, and a cycle count was recorded when an electric resistance value increased from that before the heat cycle test by equal to or more than 100%.

Results are illustrated in Table 2.

TABLE 2

| Sample No. | Addition Amount of Tin Powder | Area Occupancy of First Alloy in Penetrating Conductor (% by area) | Content of Tin in Penetrating Conductor (% by mass) | Cycle Count (counts) |
|---|---|---|---|---|
| 4 | 0.7 | 4 | 0.7 | 600 |
| 5 | 0.8 | 5 | 0.8 | 800 |
| 6 | 1 | 6 | 1 | 900 |
| 7 | 3 | 15 | 3 | 1000 |
| 8 | 5 | 25 | 5 | 800 |
| 9 | 5.5 | 26 | 5.5 | 600 |

As illustrated in Table 2, cycle counts of samples No. 5 to 8 were equal to or more than 800, and were larger than those of samples No. 4 and 9. From these results, it was found that when an area occupancy of the first alloy in a penetrating conductor was equal to or more than 5% by area and equal to or less than 25% by area, an electric resistance value was able to be kept lower even when heating up and cooling down were repeated.

From among samples No. 5 to 8, cycle counts of samples No. 6 and 7 were equal to or more than 900, and were peculiarly large. From these results, it was found that when a content of tin in a penetrating conductor was equal to or more than 1.0% by mass and equal to or less than 3.0% by mass, an electric resistance value was able to be kept lower even when heating up and cooling down were repeated.

Practical Example 3

Next, samples were fabricated of which area occupancies of a particle of copper whose circle equivalent diameter was equal to or less than 5 μm in a penetrating conductor were different from one another, and changes in electric resistance values by a heat cycle test were evaluated.

A fabricating method was similar to that of sample No. 6 according to Practical Example 2 except that a holding time interval at the maximum temperature during a thermal treatment was set to a value illustrated in Table 3. Note that sample No. 10 was the same as sample No. 6 according to Practical Example 2.

Next, an area occupancy of a particle of copper whose circle equivalent diameter was equal to or less than 5 μm in a penetrating conductor of each of the samples was computed by the following method. First, a polished surface was obtained by a method same as that according to Practical Example 1, and then a surface analysis was performed on the polished surface by using EPMA. Presence of copper was identified by color mapping of the surface analysis, and this was estimated to be a particle of copper.

Next, a particle of copper estimated from the result of color mapping was painted in black by using a photograph of a portion having the same range on which the above-mentioned surface analysis had been performed, which was taken by using SEM. Next, by using the photograph, a method named a particle analysis of the image analyzing software "A zo-kun" was applied so as to perform an image analysis, and computed a circle equivalent diameter and an area of each particle of copper. Thus, areas of particles of copper may be summed up whose circle equivalent diameters were equal to or less than 5 μm, and an area occupancy of the particles of copper whose circle equivalent diameters were equal to or less than 5 µm was computed. As analysis conditions of "A zo-kun", the brightness of particles was "dark", a method for binarization was "manual", a small-figure removal was "0.01 µm", and a threshold was "180".

Next, a heat cycle test was performed on the obtained samples by a method same as that according to Practical Example 1, and a cycle count was recorded when an electric resistance value increased from an electric resistance value before the heat cycle test by equal to or more than 100%.

Results are illustrated in Table 3.

TABLE 3

| Sample No. | Holding Time Interval (min) | Area Occupancy of Particle of Copper (% by area) | Cycle Count (counts) |
| --- | --- | --- | --- |
| 10 | 20 | 4 | 900 |
| 11 | 30 | 5 | 1200 |
| 12 | 40 | 13 | 1500 |
| 13 | 50 | 15 | 1300 |
| 14 | 60 | 16 | 1000 |

As illustrated in Table 3, cycle counts of samples No. 11 to 13 were equal to or more than 1200, and were larger than those of samples No. 10 and 14. From these results, it was found that when an area occupancy of a particle of copper whose circle equivalent diameter was equal to or less than 5 µm in a penetrating conductor was equal to or more than 5% by area and equal to or less than 15% by area, an electric resistance value was able to be kept lower even when heating up and cooling down were repeated.

Practical Example 4

Next, samples were fabricated whose contents of oxygen in penetrating conductors were different from one another, and changes in electric resistance values by a heat cycle test were evaluated.

A fabricating method was similar to that of sample No. 12 according to Practical Example 3 except that a content of oxygen contained in each of the raw material powders was adjusted so that a content of oxygen in a penetrating conductor was a value illustrated in Table 4. Note that sample No. 15 was the same as sample No. 12 according to Practical Example 3.

A heat cycle test was performed on the obtained samples by a method same as that according to Practical Example 1, and a cycle count was recorded when an electric resistance value increased from that before the heat cycle test by equal to or more than 100%.

Results are illustrated in Table 4.

TABLE 4

| Sample No. | Content of Oxygen in Penetrating Conductor (% by mass) | Cycle Count (counts) |
| --- | --- | --- |
| 15 | 0.2 | 1500 |
| 16 | 0.15 | 1600 |
| 17 | 0.08 | 1700 |

As illustrated in Table 4, cycle counts of samples No. 16 and 17 were equal to or more than 1600, and were larger than that of sample No. 15. From these results, it was found that when a content of oxygen in a penetrating conductor was equal to or less than 0.15% by mass, an electric resistance value was able to be kept lower even when heating up and cooling down were repeated.

Practical Example 5

Next, each of the samples was fabricated whose maximum thickness of its bonding layer that was nitride containing titanium and positioned in contact with an inner wall of a through hole of a penetrating conductor, and a change in an electric resistance value due to a heat cycle test was evaluated.

A fabricating method was similar to that of sample No. 17 according to Practical Example 4 except that the maximum temperature during a thermal treatment was set to a value illustrated in Table 5. Note that sample No. 18 was the same as sample No. 17 according to Practical Example 4.

Next, the maximum thickness of a bonding layer of each of the samples, which was nitride containing titanium, was measured by the following method. First, a polished surface was obtained by a method same as that according to Practical Example 1. Next, a surface analysis was performed on the polished surface as a measurement surface by using EPMA, and a layer containing titanium and nitrogen in a portion being in contact with an inner wall of a through hole of a penetrating conductor was estimated to be a bonding layer. The maximum thickness of the bonding layer was measured by a photograph taken by using SEM.

A heat cycle test was performed on each of the obtained samples by a method same as that according to Practical Example 1, a cycle count was recorded when an electric resistance value increased from that before the heat cycle test by equal to or more than 100%.

Results are illustrated in Table 5.

TABLE 5

| Sample No. | Maximum Temperature (° C.) | Maximum Thickness of Bonding Layer (µm) | Cycle Count (counts) |
| --- | --- | --- | --- |
| 18 | 780 | 2 | 1700 |
| 19 | 800 | 3 | 1900 |
| 20 | 820 | 5 | 2000 |
| 21 | 840 | 10 | 1800 |
| 22 | 850 | 11 | 1500 |

As illustrated in Table 5, cycle counts of samples No. 19 to 21 were equal to or more than 1800, and were larger than those of samples No. 18 and 22. From these results, it was found that when a penetrating conductor included, in a portion being in contact with an inner wall of a through hole, a bonding layer containing at least one selected from among components composing a substrate and the group A contained in the penetrating conductor, and the maximum thickness of the bonding layer was equal to or more than 3 µm and equal to or less than 10 µm, an electric resistance value was able to be kept lower even when heating up and cooling down were repeated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A circuit board comprising: a substrate that includes a through hole, the substrate being made of a ceramic; and a penetrating conductor positioned inside of the through hole, wherein the penetrating conductor contains silver and copper that are main components; at least one selected from a group A of titanium, zirconium, hafnium, and niobium; at least one selected from a group B of molybdenum, tantalum, tungsten, rhenium, and osmium; and a first alloy made of one of (i) silver and indium and (ii) silver and tin, wherein a content of the indium or the tin of the penetrating conductor is equal to or more than 1.0% by mass and equal to or less than 3.0% by mass of 100% by mass of all components composing the penetrating conductor.

2. The circuit board according to claim 1, wherein an area occupancy of the first alloy in the penetrating conductor is equal to or more than 5% by area and equal to or less than 25% by area.

3. The circuit board according to claim 1, wherein the penetrating conductor contains particles of the copper, and an area occupancy of particles of the copper having circle equivalent diameter of equal to or less than 5 μm is equal to or more than 5% by area and equal to or less than 15% by area.

4. The circuit board according to claim 1, wherein a content of oxygen in the penetrating conductor is equal to or less than 0.15% by mass of 100% by mass of all mass composing the penetrating conductor.

5. The circuit board according to claim 1, wherein the penetrating conductor includes, in a position being in contact with an inner wall of the through hole, a bonding layer including at least one selected from among components composing the substrate and the group A contained in the penetrating conductor, and a maximum thickness of the bonding layer is equal to or more than 3 μm and equal to or less than 10 μm.

6. The circuit board according to claim 1, further comprising: a metal layer arranged on the substrate and the penetrating conductor.

7. The circuit board according to claim 6, further comprising: a thin-film layer between the penetrating conductor and the metal layer, wherein a main component of the thin-film layer is titanium or chromium.

8. The circuit board according to claim 7, further comprising: a second alloy in an interface between the penetrating conductor and the thin-film layer, the second alloy containing a component composing the thin-film layer and at least one selected from among silver, copper, indium, and tin.

9. An electronic device comprising: the circuit board according to claim 6; and an electronic component positioned on the metal layer of the circuit board.

* * * * *